(12) United States Patent
Thurmaier

(10) Patent No.: US 6,836,109 B2
(45) Date of Patent: Dec. 28, 2004

(54) GUIDING APPARATUS FOR DOCKING A TESTING HEAD FOR ELECTRONIC COMPONENTS

(75) Inventor: Stefan Thurmaier, Bad Aibling (DE)

(73) Assignee: Multitest Elektronische Systeme GmbH, Rosenheim (DE)

( * ) Notice: Subject to any disclaimer, the term of this patent is extended or adjusted under 35 U.S.C. 154(b) by 15 days.

(21) Appl. No.: 10/413,647

(22) Filed: Apr. 15, 2003

(65) Prior Publication Data

US 2003/0217477 A1 Nov. 27, 2003

(30) Foreign Application Priority Data

Apr. 15, 2002 (DE) .......................................... 102 16 782

(51) Int. Cl.[7] .............................................. G01R 31/26
(52) U.S. Cl. ..................................... 324/158.1; 324/765
(58) Field of Search ............................. 324/765, 158.1, 324/758, 73.1, 760, 756, 757

(56) References Cited

U.S. PATENT DOCUMENTS

| 5,395,099 A | 3/1995 | Hall | |
| 5,404,111 A | * 4/1995 | Mori et al. | 324/758 |
| 5,523,678 A | * 6/1996 | Mitsui | 324/158.1 |
| 6,163,160 A | * 12/2000 | Hanrahan et al. | 324/758 |

FOREIGN PATENT DOCUMENTS

WO    WO 02/29428 A2    4/2002

* cited by examiner

*Primary Examiner*—Evan Pert
*Assistant Examiner*—Tung X. Nguyen
(74) *Attorney, Agent, or Firm*—Myers & Kaplan, LLC; Joel D. Myers, Esq.; Sandra M. Sovinski, Esq.

(57) ABSTRACT

In a guiding apparatus for positionally accurate docking of a testing head for electronic components to a handler or prober, a guiding pin is provided, arranged to be displaceable in a direction normal to its longitudinal direction on an attachment block attached on a testing head or handler/prober. Within the attachment block, a taper pin is provided longitudinally displaceable and carrying a taper tip on its end facing the guiding pin. The guiding pin has a centering recess on its side facing the taper pin. The taper tip can be brought into and out of engagement with the centering recess, wherein by inserting the taper tip into the centering recess a predetermined position of the guiding pin with respect to the attachment block, and therefore with respect to that device, which carries the guiding pin, can be achieved.

7 Claims, 3 Drawing Sheets

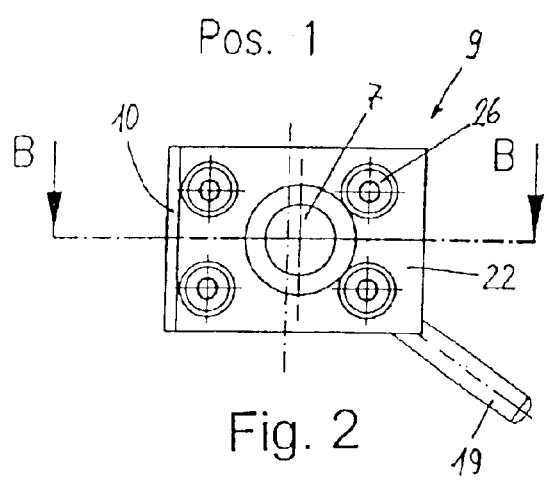
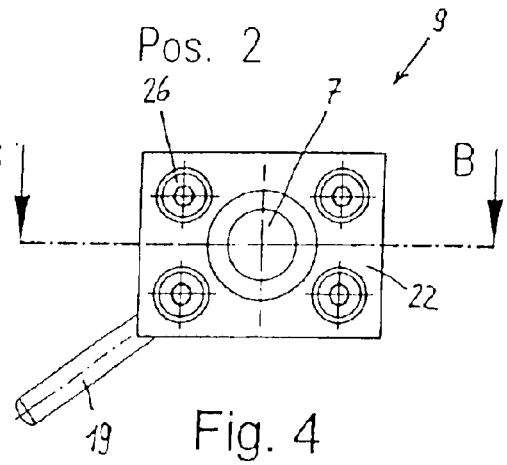
Fig. 2  Fig. 4
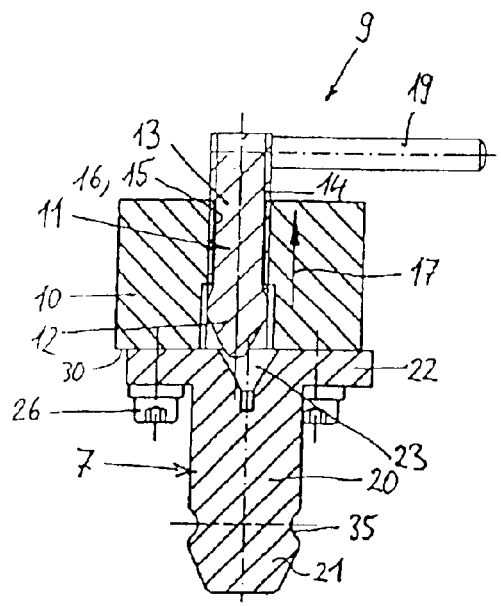
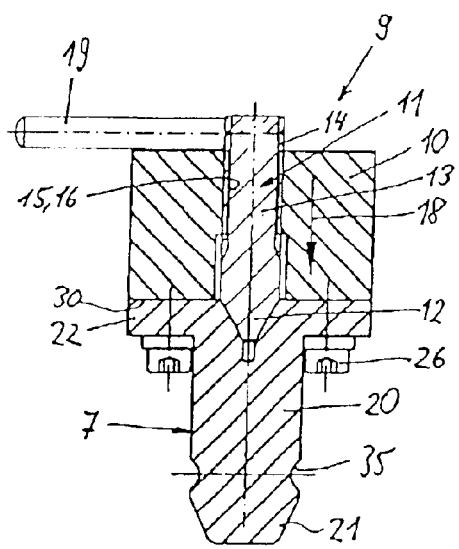
Fig. 3  Fig. 5

GUIDING APPARATUS FOR DOCKING A TESTING HEAD FOR ELECTRONIC COMPONENTS

CROSS-REFERENCE AND PRIORITY CLAIM TO RELATED APPLICATIONS

To the full extent permitted by law, the present application claims priority to and the benefit of German application, number 102 16 782.6, entitled "Fuehrungsvorrichtung zum Andocken eines Testkopfes für elektronische Bauelemente", filed Apr. 15, 2002, wherein the application is incorporated herein by reference.

BRIEF SUMMARY OF THE INVENTION

The present invention refers to a guiding apparatus for positionally accurate docking a first apparatus consisting of a testing head for electronic components and a second apparatus consisting of a handler or prober, according to the preamble of claim 1.

BACKGROUND OF THE INVENTION

For testing electronic components, such as integrated circuits (IC) it is known to use a testing apparatus having a test head which must be connected to a handling device for the electronic components, such as a handler or prober. In order to facilitate docking of the testing head having a weight of up to 1000 kg to the handling device n a manner as simple, easy and precise as possible, special docking devices, i.e. coupling devices, have been developed, which are attached on the one hand on the handling device and on the other hand on the testing head. Such docking devices usually have a plurality of guiding pins on the side of the testing head or else on the side of the handler or prober, which are inserted into corresponding centering bores for example on the side of the handler or prober in order to ensure precise positioning while bringing together the testing head and the handler or prober.

In such a docking operation, threading the guiding pins into the centering bores, in particular, is fraught with problems. To do this, the testing head must first be aligned in such a way that the guiding pins come to face the centering bores as accurately as possible, to then be able to displace the testing head in the direction of the handler or prober to such an extent that the guiding pins have been sufficiently introduced into the centering bores. Final contraction and locking is then done using well known means provided on the docking apparatus.

Due to the great mass of the testing head, it is relatively difficult to place the latter in such a way that the guiding pins come to accurately face the centering bores. This makes the docking process exceedingly difficult.

BRIEF DESCRIPTION OF THE INVENTION

It is therefore an object of the present invention to provide a guiding apparatus of the above kind enabling the docking of a testing head to a handler or prober in a manner as simple, safe and quick as possible.

The object is solved according to the present invention by the features of claim 1. Advantageous embodiments of the present invention are described in the dependent claims.

In the guiding apparatus according to the present invention, the guiding pin is arranged on an attachment block attached to one of the two devices and displaceable in a direction normal to its longitudinal direction. Within the attachment block, at taper pin is arranged displaceable in its longitudinal direction and carrying a taper tip on its end facing the guiding pin. Further, the guiding pin has a centering recess on its side facing the taper pin. The taper tip may be brought into and out of engagement with the centering recess, wherein by inserting the taper tip into the centering recess a relative position of the guiding pin with respect to the attachment block, and therefore with respect to that device which carries the guiding pin, can be achieved.

The guiding pin according to the present invention is therefore not rigid, but due to its displaceable arrangement, it is laterally moveably mounted on the associated apparatus as long as the taper tip does not engage the associated centering recess. The guiding pin is therefore able to be laterally deflected during the docking operation of the testing head to the handler or prober, considerably facilitating the threading operation of the guiding pin into the associated guiding opening of the opposite apparatus. After the threading operation, the taper pin may be axially moved causing the taper tip to plunge into the centering recess of each guiding pin thereby moving the guiding pin into the proper, centered position with respect to the attachment block, and therefore with respect to that apparatus which carries the guiding pin. The docking operation may thus be carried out in a considerably simpler, quicker and safer manner.

Advantageously, spring elements are attached on the attachment block protruding beyond the attachment block in the direction of the guiding pin and receiving the guiding pin between them to provide it with lateral guidance when the taper tip is out of engagement with the guiding pin.

Suitably the guiding pin comprises a cylindrical guiding stud and a flange to which the spring elements are laterally adjacent. The spring elements can for example consist of essentially straight, resilient metal or plastic strips, able to be sufficiently laterally deflected in order to provide the desired lateral play for the guiding pin.

According to an advantageous embodiment, the taper pin is arranged rotatable in the attachment block and longitudinally displaceable through rotation. In particular, the attachment block may comprise a threaded bore having an internal thread and the taper pin may comprise an external thread in mesh with the internal thread. Thus a spindle-like means is created causing the taper pin to be axially displaced on rotation.

Alternatively, it is also quite easily possible to provide a kind of coulisse instead of such thread in order to cause an axial displacement of the taper pin through its rotation. Further, it is quite easily possible to axially move the taper pin in any other way, such as by pneumatic, hydraulic or electrical means.

Advantageously, the centering recess has a tapering contour matched to the contour of the taper tip. This enables the guiding pin to be moved laterally into the correct final position without the need for great forces to be applied and without undue wear and tear.

According to an advantageous embodiment, axial through bores having a predetermined diameter are provided in the flange of the guiding pin. The guiding pin is mounted by means of screws to be laterally displaceable on the attachment block, the screws reaching through the through bores having radial play and being screwed into the attachment block. By means of screws of this kind, the guiding pins are held on the attachment block in connection with a spacer sleeve in an axial direction, i.e. in the insertion direction of the guiding pin, or in the longitudinal direction of the taper pin, without impeding the lateral movement of the guiding pins with respect to the attachment block.

BRIEF DESCRIPTION OF THE DRAWINGS

The invention will now be described in the following in an exemplary way with reference to the drawings, in which:

FIG. 2 is an end view of the guiding apparatus according to the present invention;

FIG. 3 is a sectional view along line B—B of FIG. 2;

FIG. 4 shows the guiding apparatus of FIG. 2 in a second position;

FIG. 5 is a sectional view along line B—B of FIG. 2;

DETAILED DESCRIPTION OF THE INVENTION

Figure 1:
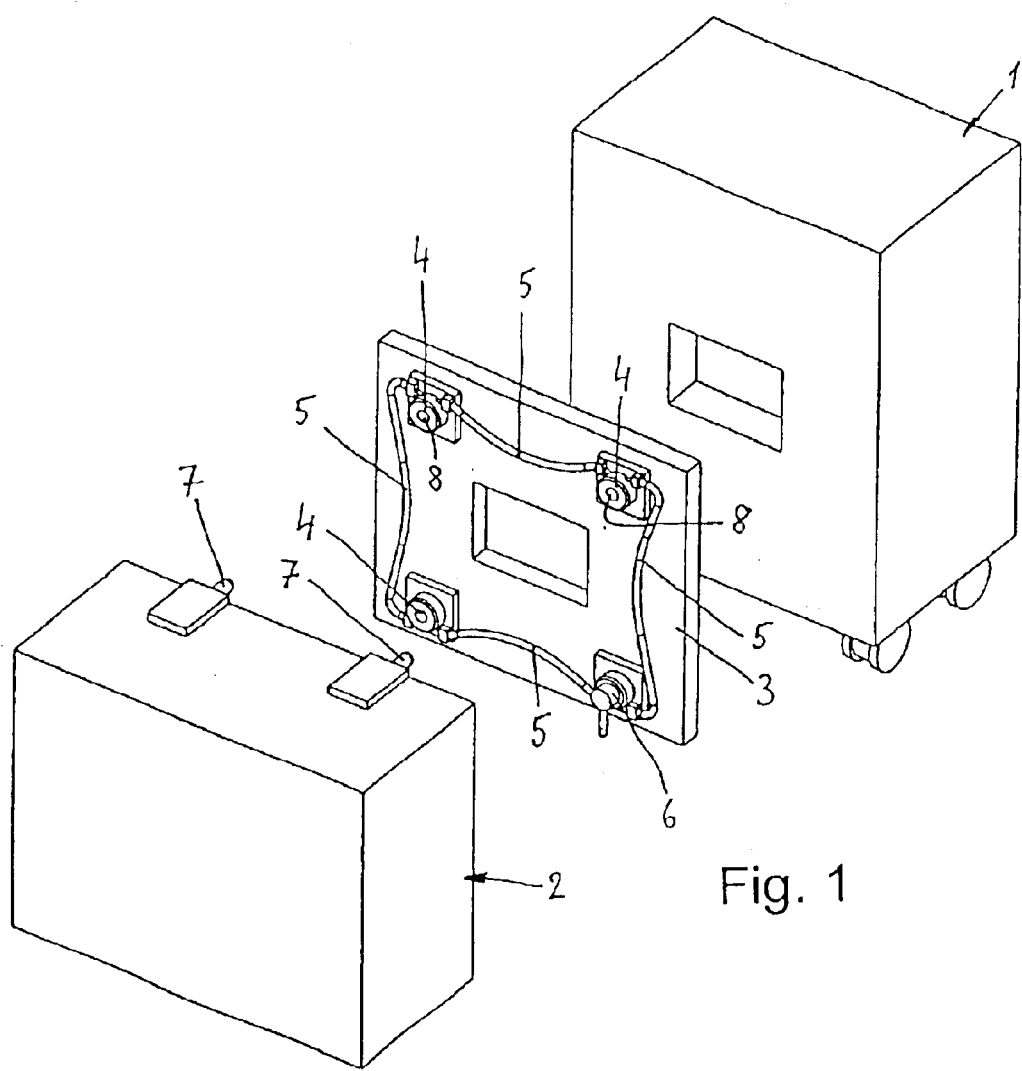
FIG. 1 is a schematic view of a handler, a testing head and a docking apparatus for coupling these two devices.
Figure 6:
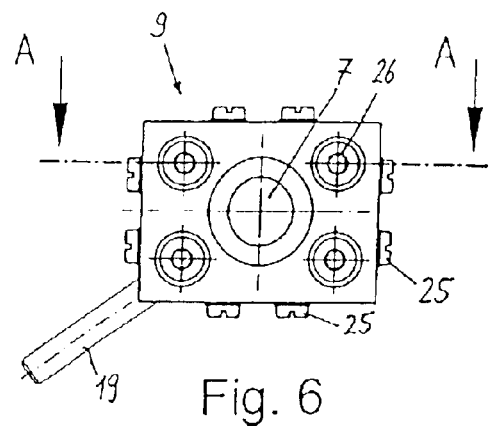
FIG. 6 is an end view of the guiding apparatus so FIG. 2, wherein the spring elements are shown in addition.

With reference to FIG. 1, schematically a handling device 1 in the form of a handler or prober for electronic components as well as a testing head 2 for measuring the electrical and/or geometrical parameters of the electronic components are shown. For docking the testing head 2 to the handling device 1, a docking plate 3 is used which is attachable either directly on the handling device 1 or to an intermediary frame (not shown), at least three locking units 4 being attached on the docking plate 3. The locking units 4 are arranged in three corner areas of the docking plate 3 and are mechanically coupled via a Bowden wire means 5 with a handling portion 6, which is in the fourth corner of the docking plate 3.

On the testing head 2, three guiding pins 7 are attached protruding from the testing head 2 in the direction of the handling device 1 or the docking plate 3 and can b brought into engagement with the locking units 4.

Docking of the testing head 2 to the handling device 1 is done in such a way that first the testing head is moved toward the handling device 1 or the docking plate 3 until the guiding pins 7 have been inserted in central guiding openings 8 of the locking units 4, thereby centering the testing head 2. Then the locking units 4 are actuated by turning the handling portion 6 in such a way that the guiding pins 7, and therefore the testing head 2, is drawn further to the docking plate 3 to its final position, and is locked in this position.

In the present exemplary embodiment, the guiding pins 7 thus not only serve to center the testing head 2 on the docking late 3 and therefore with respect to the handling device 1, but are also for axially contracting and locking by means of the locking units 4. It must be noted, however, that the guiding pins 7 may very well also be the type of guiding pins which only have a centering function, while the axial contraction of the testing head 2 ad the handling device 1 and the eventual locking may be effected b an apparatus separate from the guiding pins 7. It is further to be noted, that FIG. 1 is only a schematic view of the parts shown, and in particular also the guiding pins 7 shown, and that the arrangement, number and form of the guiding pins 7 may vary widely according to the requirements.

The guiding pins 7 are part of a guiding means for positionally accurate docking, i.e. for centering the testing head 2 with respect to the docking plate 3 and therefore to the handling device 1.

This guiding means will be described in more detail in the following with reference to FIGS. 2 to 9.

Each guiding apparatus 9 consists of guiding pin 7 held on an attachment block 10 displaceable in a direction normal to its longitudinal direction. The displaceable arrangement can be seen from a comparison of FIGS. 2 and 5, where FIG. 3 shows the guiding pin 7 in a laterally displaced, first position, and FIG. 5 shows the guiding pin 7 in a centrally aligned, second position with respect to the attachment block 10.

Within the attachment block 10, a taper pin 1 is arranged longitudinally displaceable and carrying a taper tip 12 on its end facing the guiding pin 7. Furthermore, the taper pin 11 has a cylindrical section 13 having an external thread 14. The external thread 14 is in mesh with an internal thread 15 of a central, axially arranged threaded bore 16 of the attachment block 10. Due to this spindle-like arrangement, the taper pin 11 moves in an axial direction, i.e. in the direction of arrows 17 or 18, when the taper pin 11 is rotated about its longitudinal axis in one sense or the other. This rotation is suitably carried out by means of a hand lever 19 attached to the end of the taper pin 11 opposite from the taper tip 12 and protruding from the attachment block 10.

As can be seen from FIGS. 3 and 5, the guiding pin 7 consists of a cylindrical guiding stud 20 having at its free end a conical end section 21 and, at its opposite end facing the attachment block 10, a radially protruding flange 22. The surface of the flange 22 facing the attachment block 10 is flat, in the same way as the contact surface 30 of the attachment block 10 facing the flange 22.

From the surface of the guiding pin 7 facing the attachment block 10, a centering recess 23 having a tapering contour in the axial direction of the guiding pin 7 extends downwardly, this contour in the axial direction of the guiding pin 7 extends downwardly, this contour being matched to the contour of the taper tip 12. When the taper pin 11 is in the position shown in FIG. 3 axially withdrawn to the top, the taper tip is out of engagement with the side wall of the centering recess 23, so that the guiding pin 7 is laterally moveable with respect to the attachment block 10. If, however, as can be seen from FIG. 5, the taper pin 11 is rotated in such a way, that it is moved axially downward and plunges into the centering recess 23, the taper pin 12 comes into contact with the side wall of the centering recess 23, whereby the guiding pin 7 is centered, i.e. brought into alignment with the taper pin 11. In this position, the guiding pin 7 is fixed and centered in the lateral direction.

As can be seen from FIGS. 6 to 9, the guiding pin 7 is biased to a central position with respect to the attachment block 10 by means of eight lateral spring elements 24. To do this, two spring elements 24 are screwed on by means of screws 25 on each of the four side walls of the square-parallelepiped attachment block 10. The spring elements 24 protrude to the bottom from the attachment block 10 and at least partially overlap the side walls of the flange 22. The flange 22 is also in the form of a parallelepiped and has the same base as the attachment block 10. If the center axis of the guiding pin 7 is aligned with the one of the attachment block 10, non of the spring elements have been deflected, and all spring elements 24 extend vertically downward. The screws 25, however, are arranged at a certain distance above the bottom contact surface 30 of the attachment block 10, and the spring elements 24 have sufficient flexibility to be able to yield laterally when a lateral force is applied to the guiding pin 7 and the taper pin 11 is out of engagement with the centering recess 23.

The guiding pin 7 is therefore arranged laterally displaceable on the attachment block 10 while at the same time it is biased to a central position with respect to the attachment block 10 by the spring elements 24.

Figures 7, 8:
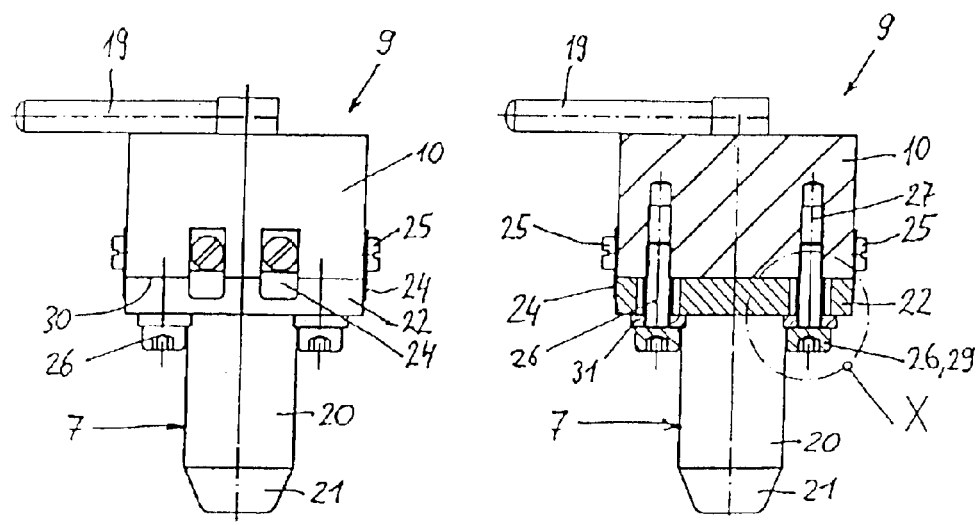
FIG. 7 is a side view of the guiding apparatus.
FIG. 8 is a sectional view along line A—A of FIG. 6.
Figure 9:
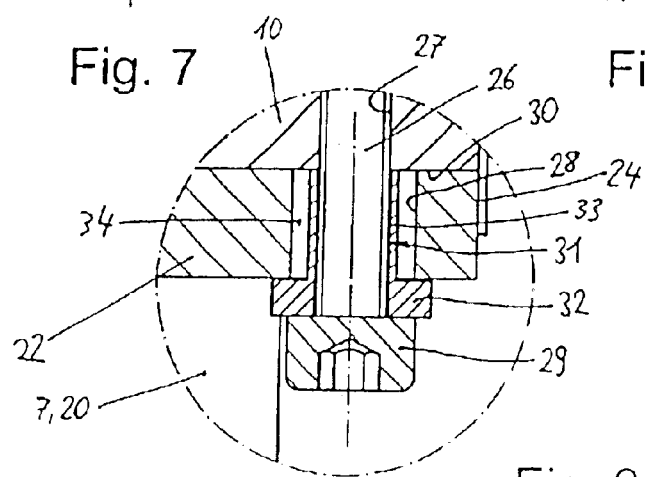
FIG. 9 shows detail X of FIG. 8 in an enlarged scale.

With reference to FIGS. 8 and 9, the axial support of the guiding pin 7 on the attachment block 10 will be described in more detail. As can be seen, the guiding pin 7 is attached in the area of its flange 22 by means of four screws 26 on the attachment block 10. The screws 26 are screwed into axial threaded bores 27 of the attachment block 10 and extend through axial through bores 28 of the flange 22 having a considerably greater diameter than the screw shanks. Between the screw head 29 of each screw 26 and the contact surface 30 of the attachment block 10, there is a spacer sleeve 31 slipped onto each screw 26 and clamped between the contact surface 30 and the screw head 29. The spacer sleeve 31, on its end adjacent the screw head 29, carries a radially protruding collar 32 having an outer diameter greater than the inner diameter of the through bores 28. The remaining section 33 of the spacer sleeve 31 has an outer diameter which is considerably smaller than the inner diameter of the through bores 28, so that between this section 33 and the wall of the through bores 28 an annular free space 34 is provided. Furthermore, the length of the section 33 is a little greater than the thickness of the flange 22, so that the flange 22 is not tightly pressed by the collar 32 against the attachment block 10, but is left with a little axial play by the collar 32 and therefore free to move in a lateral direction.

Note that, in FIG. 3, the lateral displacement of the guiding pins 7 with respect to the attachment block 10 is shown in a somewhat exaggerated way. In practice, a very slight lateral deflectability of the guiding pins 7 will suffice to enable easy threading into the corresponding guiding openings 8. Furthermore, the spring elements 24 have been omitted from FIGS. 2 to 5 only for reasons of simplified graphic representation. The circumferential radial groove 35 shown in FIGS. 3 and 5 is for the simultaneous axial locking of the guiding pin 7 within the locking devices 23 while this locking action has not been described in detail since it is not essential in the context of the present invention. This radial groove 35 can be omitted, as can be seen from FIGS. 7 and 8, if axial locking is achieved in any other way.

What is claimed is:

1. A guiding apparatus for positionally accurate docking of a first device consisting of a testing head for electronic components and a second device consisting of a handler or prober, having at least one guiding pin attached to one of the devices, the guiding pin being insertable into a guiding opening provided on the other device, characterized in that the guiding pin is arranged displaceable in a direction normal to its longitudinal direction on an attachment block attached on one of the two devices, within the attachment block a taper pin is arranged longitudinally displaceable and carrying a taper tip its end facing the guiding pin, the guiding pin has a centering recess on its side facing the taper pin, and the taper tip can be brought into and out of engagement with the centering recess, wherein by inserting the taper tip into the centering recess, a predetermined position of the guiding pin with respect to the attachment block, and therefore with respect to that device which carries the guiding pin, can be achieved.

2. The guiding apparatus according to claim 1, characterized in that on the attachment block spring elements are attached protruding from the attachment block in the direction of the guiding pin and receiving the guiding pin between them in order to laterally guide it when the taper tip is out of engagement with the guiding pin.

3. The guiding apparatus according to claim 2, characterized in that the guiding pin has a cylindrical guiding stud and a flange laterally adjacent to the spring elements.

4. The guiding apparatus according to claim 1, characterized in that the taper pin is arranged to be rotatable within the attachment block and longitudinally displaceable by means of rotation.

5. The guiding apparatus according to claim 4, characterized in that the attachment block has a threaded bore having an internal thread and the taper pin has an external thread in mesh with the internal thread.

6. The guiding apparatus according to claim 1, characterized in that the centering recess has a tapering contour matched to the contour of the taper tip.

7. The guiding apparatus according to claim 3, characterized in that the flange of the guiding pin axial through bores having a predetermined diameter are provided, and in that the guiding pin is supported by means of screws on the attachment block to be laterally displaceable, the screws extending through the through bores having radial play and being screwed into the attachment block.

* * * * *